United States Patent
Das et al.

(10) Patent No.: US 8,395,538 B2
(45) Date of Patent: Mar. 12, 2013

(54) HIGH SPEED RESISTOR-DAC FOR SAR DAC

(75) Inventors: Abhijit Kurmar Das, Dallas, TX (US); Krishnasawamy Nagaraj, Plano, TX (US); Joonsung Park, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 106 days.

(21) Appl. No.: 13/164,478

(22) Filed: Jun. 20, 2011

(65) Prior Publication Data

US 2012/0319886 A1   Dec. 20, 2012

(51) Int. Cl.
  H03M 1/34   (2006.01)
(52) U.S. Cl. .................... 341/163; 341/156; 341/172
(58) Field of Classification Search .................. 341/144, 341/155, 156, 163, 172
  See application file for complete search history.

(56) References Cited

U.S. PATENT DOCUMENTS

| | | | | |
|---|---|---|---|---|
| 7,286,075 | B2 * | 10/2007 | Hennessy et al. | 341/172 |
| 7,439,896 | B2 * | 10/2008 | Sutardja | 341/150 |
| 7,928,871 | B2 * | 4/2011 | Aruga et al. | 341/118 |
| 8,310,388 | B2 * | 11/2012 | Chang et al. | 341/156 |
| 2003/0123646 | A1 | 7/2003 | Srinivasan | |
| 2005/0057387 | A1 | 3/2005 | Janakiraman | |
| 2005/0083221 | A1 | 4/2005 | Seymour | |
| 2007/0200831 | A1 | 8/2007 | Wang | |
| 2008/0036632 | A1 | 2/2008 | Viswanathan | |
| 2008/0186214 | A1 | 8/2008 | Janakiraman | |
| 2008/0258959 | A1 | 10/2008 | Trifonov et al. | |
| 2008/0297390 | A1 * | 12/2008 | Ko et al. | 341/144 |
| 2009/0027251 | A1 | 1/2009 | Ohnhauser et al. | |
| 2009/0073011 | A1 | 3/2009 | Trifonov et al. | |
| 2009/0073018 | A1 | 3/2009 | Mitikiri | |
| 2010/0026546 | A1 | 2/2010 | Ohnhaeuser et al. | |
| 2010/0194619 | A1 | 8/2010 | Ohnhaeuser et al. | |
| 2010/0214140 | A1 | 8/2010 | Reinhold et al. | |
| 2010/0231241 | A1 | 9/2010 | Muek et al. | |
| 2010/0244858 | A1 | 9/2010 | Cormier, Jr. et al. | |
| 2010/0244859 | A1 | 9/2010 | Cormier, Jr. et al. | |

* cited by examiner

*Primary Examiner* — Peguy Jean Pierre
(74) *Attorney, Agent, or Firm* — John R. Pessetto; W. James Brady; Frederick J. Telecky, Jr.

(57) ABSTRACT

A singled-ended, successive approximation register analog-to-digital converter convert an analog input voltage to a digital representation comprising m upper order bits and a number of lower order bits. The SAR ADC comprises SAR logic, a resistive network, multiple switches, and first and second LSB capacitors. The switches also comprises two sets of switches coupled to the resistive network, each set of switches is configured to couple a selected tap to each of the first and second LSB capacitors. When determining the lower order bits, the SAR logic is configured to control the sets of switches to change the first and second taps from one cycle in which one of the lower order bits is determined to a next cycle in which the next of the lower order bits is determined so that the voltage of both taps changes by a decreasing amount with each succeeding bit being determined.

10 Claims, 2 Drawing Sheets

HIGH SPEED RESISTOR-DAC FOR SAR DAC

BACKGROUND

An analog-to digital converter (ADC) converts an analog input voltage to a digital representation. Many ADC converts operate according to a successive approximation register (SAR) technique. SAR ADCs sequentially compare the analog input voltage to various reference voltage levels which are generated by a digital-to-analog converter (DAC). During a first clock cycle, the sampled input voltage is compared to half of the reference voltage output by the DAC. If the analog input voltage is greater than half the reference voltage, then a respective bit decision relating to the most significant bit (MSB) is made. During the next clock cycle, the input voltage is compared to three quarters or one quarter of the reference voltage in accordance with the preceding MSB decision, and a further bit decision is made relating to the next less significant bit (MSB−1). The conversion procedure carries on accordingly, and the DAC output voltage converges successively to the analog input voltage, while evaluating one bit during each clock cycle.

Some SAR ADCs implement a charge redistribution technique which uses an array of capacitors. The charge stored on the capacitors is manipulated to perform the conversion from analog to digital. Some SAR ADCs also include a least significant bit (LSB) capacitor that is connected to a resistor network. Various tap points along the resistor network are coupled to the LSB capacitor to generate additional bit decisions.

Because SAR ADCs typically include capacitors and resistors, the voltages generated based on the reference voltage take a finite amount of time to settle before the comparison to make a bit decision can be made. The settling time of the ADC thus is a significant parameter that can detrimentally effect ADC performance.

SUMMARY

In accordance with at least some embodiments, a singled-ended, successive approximation register (SAR) analog-to-digital converter (ADC) is configured to convert an analog input voltage to a digital representation comprising m upper order bits and a number of lower order bits. The SAR ADC comprises SAR logic, a resistive network; a plurality of switches individually controlled by the SAR logic, and a plurality of most significant bit (MSB) capacitors, some of which are connected to a static voltage. The SAR ADC also comprises a pair of least significant bit (LSB) capacitors, a first LSB capacitor connected to one of the switches that selectively couples said first LSB capacitor to a reference voltage (Vref) or a selected first tap in said resistive network, and a second LSB capacitor connected to one of the switches that selectively couples the second LSB capacitor to the analog input voltage or a selected second tap in the resistive network. The plurality of switches also comprises two sets of switches coupled to the resistive network, each set of switches is configured to couple a selected tap to each of the first and second LSB capacitors. When determining the lower order bits, the SAR logic is configured to control the sets of switches to change the first and second taps from one cycle in which one of the lower order bits is determined to a next cycle in which the next of the lower order bits is determined so that the voltage of the first and second taps changes by $Vref/[2^{(n-m+1)}]$ where n is the nth bit being determined.

In accordance with other embodiments, a singled-ended, successive approximation register (SAR) analog-to-digital converter (ADC) is configured to convert an analog input voltage to a digital representation comprising m upper order bits and a number of lower order bits. The SAR ADC comprises SAR logic, a resistive network, a plurality of switches individually controlled by the SAR logic, and a pair of least significant bit (LSB) capacitors. The LSB capacitors comprises a first LSB capacitor connected to one of the switches that selectively couples the first LSB capacitor to a reference voltage (Vref) or a selected first tap in the resistive network, and a second LSB capacitor connected to one of the switches that selectively couples the second LSB capacitor to the analog input voltage or a selected second tap in the resistive network. The plurality of switches also comprises two sets of switches coupled to the resistive network, each set of switches is configured to couple a selected tap to each of the first and second LSB capacitors. When determining the lower order bits, the SAR logic is configured to control the sets of switches to change the first and second taps from one cycle in which one of the lower order bits is determined to a next cycle in which the next of the lower order bits is determined so that the voltage of both the first and second taps changes by a decreasing amount with each succeeding bit being determined.

In yet other embodiments, a method of converting an analog input voltage to a digital representations comprises determining each of a plurality of upper order bits, and, for each of a plurality of lower order bits, changing a voltage to each of a pair of capacitors and comparing the analog input voltage to a node voltage generated, at least in part, by the capacitors.

BRIEF DESCRIPTION OF THE DRAWINGS

For a detailed description of exemplary embodiments of the invention, reference will now be made to the accompanying drawings in which.

NOTATION AND NOMENCLATURE

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct electrical connection. Thus, if a first device couples to a second device, that connection may be through a direct electrical connection, or through an indirect electrical connection via other devices and connections.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Figure 1:
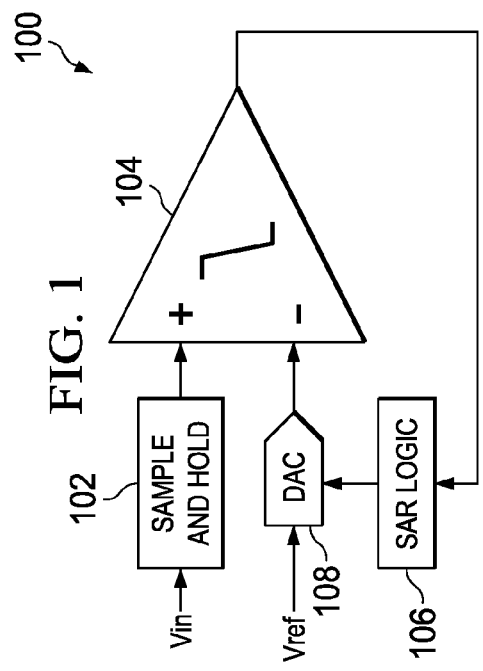
FIG. 1 shows a preferred embodiment of a SAR ADC.

FIG. 1 shows an analog-to-digital converter (ADC) 100 in accordance with the preferred embodiments of the invention. The ADC 100 of the preferred embodiment is representative of a successive approximation register (SAR) class of ADCs. The SAR ADC 100 comprises a sample and hold unit 102, a comparator 104, SAR logic 106, and a digital-to-analog converter (DAC) 108. The analog input voltage (Vin) to be converted to digital form is provided as an input to the sample and hold unit 102. The comparator 104 compares Vin to the voltage generated by the DAC 108, and the DAC 108 is controlled by the SAR logic 106. The comparator 104 sequentially generates one output bit at a time during the conversion process. A reference voltage, Vref, is provided to the DAC 108. The voltage Vref represents the full scale range of the input voltage. That is, the input voltage Vin is a voltage between Vref and ground.

The ADC 100 of the preferred embodiments can have any desired number of bits. For example, ADC 100 may be a 12-bit converter meaning that the analog input voltage is converted to a 12-bit output digital representation. Digital representations other than 12 bits are also possible. By way of example, a 12-bit ADC is assumed throughout much of the following discussion. That a 12-bit ADC is discussed should in no way limit the scope of this disclosure to only 12-bit ADCs.

Figure 2:
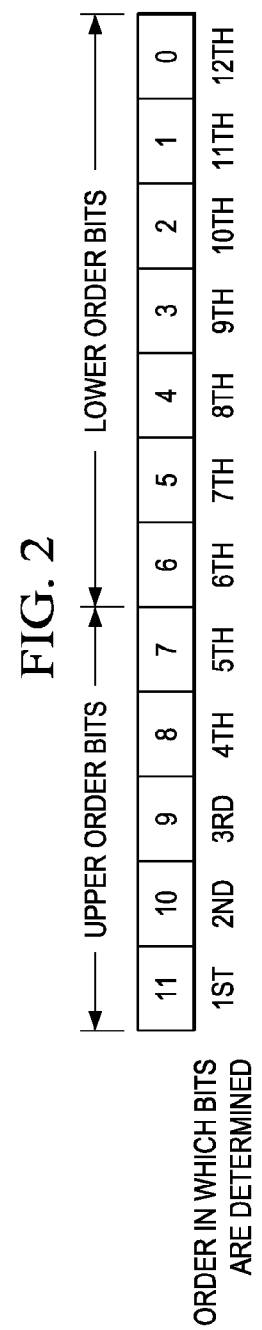
FIG. 2 depicts a digital representation of the output of the SAR ADC of the preferred embodiment.

The digital output representation is divided into upper order bits and lower order bits. FIG. 2, for example, illustrates a 12-bit output designated as bit 0 through bit 11. Bit 11 is the most significant bit and bit 0 is the least significant bit. A specified number of the most significant bits are referred to as the upper order bits. The remaining bits are referred to as the lower order bits. In the example of FIG. 2, there are 5 upper order bits and 7 lower order bits, although in other embodiments, the numbers of upper and lower order bits can be different than 5 and 7. The example provided below assumes 5 upper order bits and 7 lower order bits. The variable "m" is used to denote the number of upper order bits. Thus, m is 5 in this example.

The ADC 100 of the preferred embodiment converts an analog input voltage (Vin) to a digital representation one bit at a time starting with the most significant bit (bit 11). Then, bit 10 is determined, then bit 9, and so on, through the least significant bit (bit 0). Thus, the first bit determined is bit 11, the second bit determined is bit 10, and so as indicated in FIG. 2. As can be seen, the five upper order bits are determined before the lower order bits are determined.

Figure 3:
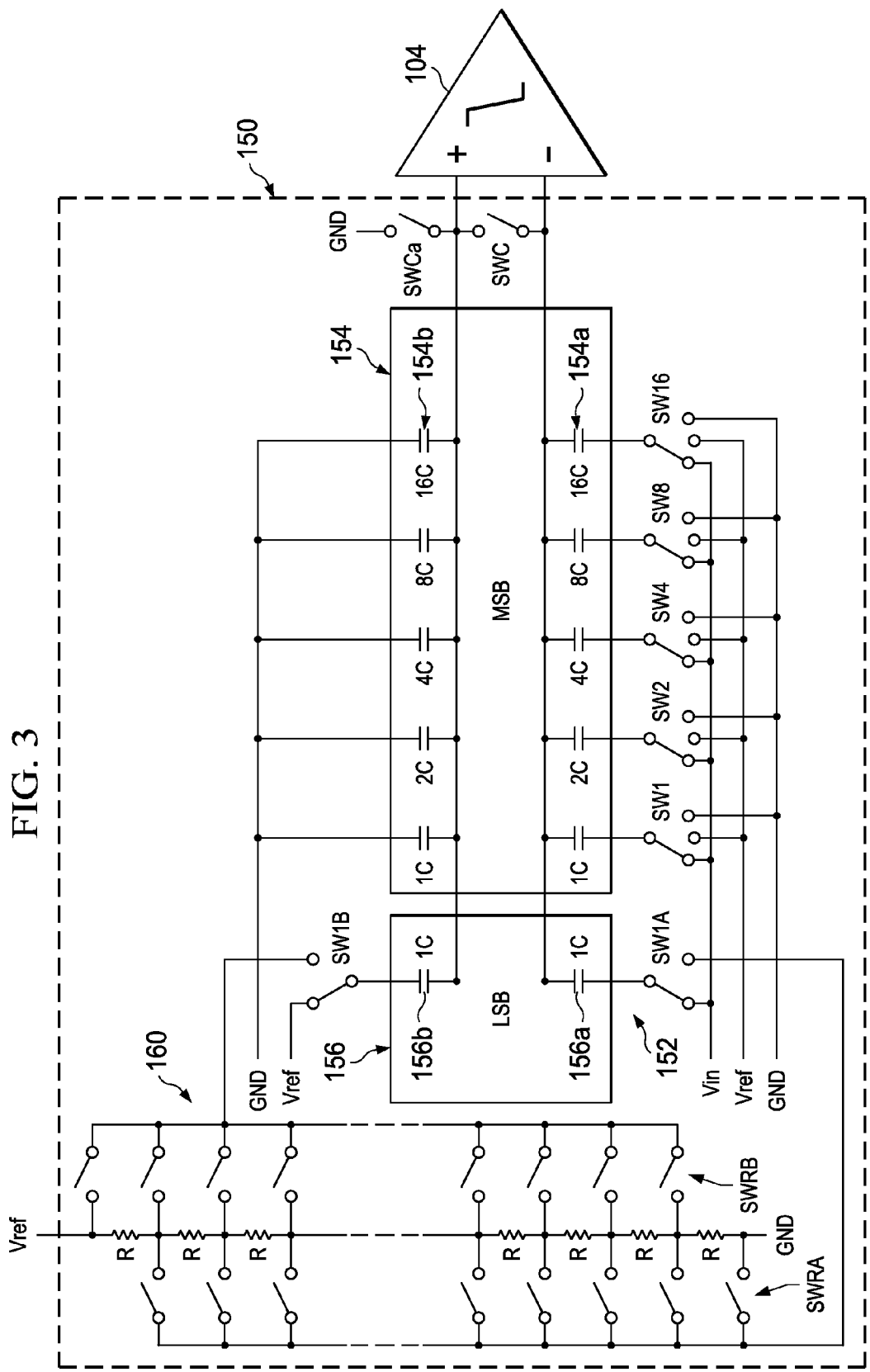
FIG. 3 shows a preferred embodiment of the DAC usable in the SAR ADC of FIG. 1.

FIG. 3 shows an illustrative implementation of a DAC 150. FIG. 3 shows the DAC 150 and the comparator 104 and omits the SAR logic 106 for ease of understanding. The sample and hold function of sample and hold unit 102 is inherent in the operation of the DAC 150, and thus the embodiment of FIG. 3 does not include a separate sample and hold unit apart from the DAC.

The DAC 150 of FIG. 3 includes a capacitive network 152 (also referred to as a "CDAC"). The CDAC 152 preferably comprises multiple MSB capacitors 154 and a pair of LSB capacitor 156. The MSB capacitors 154 include two groups of capacitors, each group having some (e.g., half) of the total MSB capacitors. The bottom group 154a of capacitors in FIG. 3 are designated as 1C, 2C, 4C, 8C and 16C ("C" referring to a capacitance value). Thus, the 2C capacitor has twice the capacitance value as the 1C capacitor and one-fourth the capacitance value of the 8C capacitor. Further, the 16C capacitor has 16 times the capacitance of the 1C capacitor.

The top group 154b of capacitors also comprise 1C, 2C, 4C, 8C and 16C capacitors as shown.

The top group 154b of the MSB capacitors have terminals that are all connected to a static voltage such as ground. The static voltage, however, can be other than ground as desired. In this example, the other terminals of the MSB capacitors in group 154b are all connected together and provided to the non-inverting input of comparator 104.

The bottom group 154a of the MSB capacitors have upper terminals that are all connected together and provided to the inverting input of comparator 104 in this example. Each of the other terminals of the bottom group 154a of MSB capacitors is connected to a switch. Capacitor 16C in group 154a connects to a switch designated as SW16. Capacitor 8C in group 154a connects to switch SW8. Similarly, capacitors 4C, 2C and 1C in group 154a connect to switches SW4, SW2, and SW1, respectively. Each of switches SW1-SW16 is independently and separately controlled by SAR logic 106. That is, each switch SW1-SW16 can be controlled by SAR logic 106 without regard to the states of the other switches. Each such switch SW1-SW16 can selectively connect its respective capacitor to one of Vin, Vref and ground (GND).

The CDAC also comprises a pair of LSB capacitors 156 comprising capacitors 156a and 156b. One terminal of each capacitor 156a, 156b connects to an input of comparator 104 as shown. The other terminal of capacitors 156a, 156b connects to a switch which also is controlled by SAR logic 106. Capacitor 156a connects to switch SW1A and capacitor 156b connects to switch SW1B. Switch SW1A selectively connects capacitor 156a to either Vin or a tap in a resistive network 160. Switch SW1B selectively connects capacitor 156b to either Vref or a tap in a resistive network 160.

DAC 150 also comprises a resistive network 160. The resistive network 160 comprises multiple, serially-connected resistors R connected between Vref and ground. Preferably, the resistors R all have the same or similar resistance value and thus the voltage across the resistive network 160 preferably is divided evenly among the various resistors R. Any suitable number of resistors R can be provided. In some embodiments, for example, the resistor network 160 includes 128 resistors. The node points ("taps") between pairs of adjacent resistors R can be coupled to the LSB capacitors 156 via switches SWRA and SWRB which are controlled by SAR logic 106. The SAR logic 106 can selectively close one of switches SWRA to couple a selected tap from the resistive network 160 to switch SW1A and thus to LSB capacitor 156a. Similarly, the SAR logic 106 can selectively closed one of switches SWRB to couple a selected tap from the resistive network 160 to switch SW1B and thus to LSB capacitor 156b. A resistor network 160 having, for example, 128 resistors may have 129 tap points and thus 129 switches in switch set SWRA and 129 switches in switch set SWRB. Each switch set can access any voltage from ground to Vref and at each node between each adjacent pair of resistors.

A switch SWC is provided across the inputs to the comparator 104 to short the comparator inverting and noninverting inputs together during sampling. The switch SWCa also connects the comparator inputs to ground in this example.

The implementation shown in FIG. 3 comprises a 5-bit MSB C-DAC and a 7-bit LSB resistive DAC (R-DAC) for a total of 12 bits, as noted above. However, the number of capacitors, switches and resistors can be varied in other embodiments to achieve whatever level of digital conversion resolution is desired for a given application.

The operation of the SAR ADC 100 will now be described. During sampling, switch SWC and SWCa is closed and switches SW1-SW6 are switched to Vin. Also, in the example of FIG. 3, switch SW1B is connected to Vref. Then, during the hold mode, switch SWC and SWCa is opened while switches SW16, SW8, SW4, SW2, SW1, and SW1A are connected to ground (with the lowest most switch (i.e., the switch connected to GND) in switch set SWRA closed). As a result, a voltage of −Vin is applied to the inverting input of comparator 104. As such, DAC 150 has built-in sample and hold functionality.

The analog-to-digital conversion process is a multi-step process. The upper order bits (5 bits in this example including bits [11:7]) are determined through operation, by SAR logic 106, of the switches SW16-SW1 and use of the MSB capacitors 154. During the first conversion step, the largest capacitor 16C is connected via switch SW16 to the reference voltage, Vref, which corresponds to the full scale range of ADC 100. Capacitor 16C forms a capacitor divider with the remaining capacitors connected to ground and whose equivalent capacitance also is 16C (capacitors 8C, 4C, 2C, 1C, and 1C in parallel have an equivalent capacitance of 16C). As such, one half of Vref is superimposed on the inverting input of the comparator 104, which already had a voltage of −Vin. Thus, the voltage on the inverting terminal of the comparator is −Vin+Vref/2.

The mid point of the full Vref voltage range (Vref/2) (also referred to as the "MSB voltage") is the voltage at which the most significant changes between a 0 and a 1. That is, if Vin is less than Vref/2, the most significant bit (bit 11) is a 0, whereas if Vin is greater than Vref/2, the most significant bit is a 1. The inverting input to the comparator 104 has the voltage −Vin+Vref/2 and the non-inverting input of the comparator has a voltage equal to ground via capacitors 154b. Thus, the output of the comparator 104 is a 1 if Vin is greater than Vref/2 and a 0 if Vin is less than Vref/2. The output state of comparator 104 is captured and stored by the SAR logic 106 as the most significant bit. At this point, it is known whether the input voltage Vin is in the lower half of the full Vref voltage range or in the upper half of the full Vref voltage range.

To determine the next upper order bit (bit 10), switch SW8 is controlled by SAR logic 106 to connect Vref to capacitor 8C. Further, if the first conversion step for the MSB (bit 11) resulted in the most significant bit being determined to be a 0, then switch SW16 is flipped to ground, otherwise SW16 remains connected to Vref if the most significant bit is a 1. The inverting input to the comparator 104 will be equal to −Vin+ ¾(Vref) if the most significant bit from the first step was determined to be a 1. Alternatively, the inverting input voltage to the comparator 104 will be equal to −Vin+¼(Vref) if the most significant bit from the first step was determined to be a 0. Alternatively stated, the node voltage on the inverting input to the comparator is forced to the midpoint voltage of whichever voltage range (upper half or lower half) was determined to contain Vin in the first step. The output of the comparator 104 indicates in which half of the upper/bottom half (i.e., which quartile) Vin lies. For example, if the first step resulted in a most significant bit of 0, then it is known that Vin is between ground and Vref/2. Then, in the second cycle, the range between ground and Vref/2 (in which Vin is known to reside) is itself divided in two equal portions by a midpoint voltage (i.e., Vref/4) and Vin is again compared to the new midpoint voltage. If Vin is below the new midpoint voltage, the next upper order bit (bit 10) is a 0, otherwise the next upper order bit is a 1.

This process continues for each succeeding MSB capacitor 154 until the five (in the example of FIG. 3) upper order bits (i.e., bits [11:7]) are determined. At that point, switches SW16-SW1 are maintained in a fixed position as determined by the preceding five cycles in which the five upper order bits were determined. The SAR logic 106 begins to control switches SW1A and SW1B and the resistor network switches SWRA and SWRB to have the lower order bits (e.g., 7 in the example of FIG. 3) determined to complete the conversion process.

In some SAR ADC configurations, the first of the lower order bits is determined by switching the voltage on one LSB capacitor from ground to the midpoint tap of a resistive network. The other LSB capacitor in such configurations is statically tied to a voltage such as ground. The midpoint tap is used to continue the comparison process similar to that described above, with each succeeding iteration using the midpoint tap in the voltage subrange that was determined to contain Vin in the preceding cycle. If Vref is 3V, then the first lower order bit determination, which taps out the midpoint of the resistive network represents a voltage jump of 1.5 V which takes quite a long time to sufficiently settle to continue the conversion process. Longer settling time impairs the conversion performance.

In accordance with the preferred embodiments, however, rather than having one of the LSB capacitors experience a Vref/2 voltage jump for determining the first of the lower order bits, two switches SW1A and SW1B are coupled to the LSB capacitor pair to couple each LSB capacitor to a selected tap on the resistive network 160 in such a manner that each LSB capacitor experiences a much smaller voltage change. Smaller voltage changes in each such cycle of the process result in faster settling times.

In accordance with the preferred embodiments of the invention, rather than force only one of the LSB capacitor to have the full Vref/2 voltage change during the determination of the first of the lower order bits, the SAR logic 106 closes one of the switches SWRA at the quarter-point of the resistive network 160 and closes one of switches SWRB at the three-quarter point of the resistive network 160. As such, the voltage to LSB capacitor 152a is forced up from 0 to ¼(Vref) and the voltage to LSB capacitor 152b is forced down from Vref to ¾(Vref). Each LSB capacitor 152 thus experiences a one-quarter of Vref voltage change rather than a ½(Vref) voltage change as may be the case in other SAR ADC implementations. The net effect on the node voltage to the comparator is the same either way—a ½(Vref) voltage change across the inputs to the comparator—but, each LSB capacitor 152 sees a change on one of its terminals limited to one-quarter of Vref. The resulting voltage that is generated based on the selected taps of the resistor network 160 is the voltage that corresponds to bit being determined. That is, an input voltage (Vin) greater than the generated voltage using the resistor network means that the bit is a 1 and Vin less than the generated voltage means that the bit is a 0.

Once the tap voltages are applied through switches SW1A and SW1B to the LSB capacitors 152, the output of comparator 104 indicates whether Vin is greater or smaller than the voltage generated based on the resistor network and CDAC combination. If the comparator output is high, the current bit is determined to be a 1 and the comparator output is low, then the bit is determined to be a 0.

The determination of the next lower order bit includes selecting different tap points. Each tap point is moved (i.e., raised or lowered), via SAR logic 106 control of switches SWRA and SRB, by ⅛(Vref). Further, the two tap points are moved by ⅛(Vref) in opposite directions and the directions are based on the value of the previously determined bit. For example, if the previous bit is determined to be a 0, the lower tap, selected by switches in switch set SWRA and applied to LSB capacitor 152a, is moved downward (toward ground) by ⅛(Vref). The upper tap is moved upward toward Vref by an amount equal to ⅛(Vref). On the other hand, if the previous bit is determined to be a 0, the lower tap is moved upward toward Vref by an amount equal to ⅛(Vref) and the upper tap is lowered by ⅛(Vref). The comparator output then indicates the value of the bit.

Each succeeding lower order bit is determined in a similar way. Each such determination includes raising or lowering the tap points by a smaller and smaller amount with each cycle. The movement of the tap points is towards or away from each other and depends on the state of the previously determined bits as explained above. The absolute value of the change in each tap point voltage is given by the following mathematical function (which applies once the lower order bits are being determined):

$$\text{change in tap voltage} = Vref/[2^{(n-m+1)}]$$

where m is the number of upper order bits and n represents the nth bit being determined. For example, a 12-bit converter having 5 upper order bits and 7 lower order bits, m is 5. To determine, for example, the 9$^{th}$ bit (n=9) in the sequence (which actually is bit number 3 in a 12-bit representation, see FIG. 2), the tap point/voltages are changed from their prior setting for the previous bit by an amount equal to $Vref/[2^{(5)}]$ which is Vref/32. Thus, the tap points are raised or lower, depending on the value of preceding 8$^{th}$ bit by a voltage equal to one-thirty second of Vref.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A singled-ended, successive approximation register (SAR) analog-to-digital converter (ADC) configured to convert an analog input voltage to a digital representation comprising m upper order bits and a number of lower order bits, comprising:
    SAR logic;
    a resistive network;
    a plurality of switches individually controlled by said SAR logic;
    a plurality of most significant bit (MSB) capacitors, some of which are connected to a static voltage; and
    a pair of least significant bit (LSB) capacitors, a first LSB capacitor connected to one of the switches that selectively couples said first LSB capacitor to a reference voltage (Vref) or a selected first tap in said resistive network, and a second LSB capacitor connected to one of the switches that selectively couples said second LSB capacitor to the analog input voltage or a selected second tap in said resistive network;
    wherein said plurality of switches also comprises two sets of switches coupled to said resistive network, each set of switches is configured to couple a selected tap to each of said first and second LSB capacitors; and
    wherein, when determining the lower order bits, said SAR logic is configured to control the sets of switches to change the first and second taps from one cycle in which one of the lower order bits is determined to a next cycle in which the next of the lower order bits is determined so that the voltage of the first and second taps changes by $Vref/[2^{(n-m+1)}]$ where n is the nth bit being determined.

2. The SAR ADC of claim 1, wherein the voltage change of the first tap is in a direction opposite that of the voltage change of the second tap.

3. The SAR ADC of claim 1 wherein the direction of change of the voltage of each tap is a function of the preceding determined bit.

4. The SAR ADC of claim 1 wherein each of at least some of said MSB capacitors is connected to a switch that connects to the analog input voltage, Vref, and ground.

5. A singled-ended, successive approximation register (SAR) analog-to-digital converter (ADC) configured to convert an analog input voltage to a digital representation comprising m upper order bits and a number of lower order bits, comprising:
    SAR logic
    a resistive network;
    a plurality of switches individually controlled by said SAR logic; and
    a pair of least significant bit (LSB) capacitors, a first LSB capacitor connected to one of the switches that selectively couples said first LSB capacitor to a reference voltage (Vref) or a selected first tap in said resistive network, and a second LSB capacitor connected to one of the switches that selectively couples said second LSB capacitor to the analog input voltage or a selected second tap in said resistive network;
    wherein said plurality of switches also comprises two sets of switches coupled to said resistive network, each set of switches is configured to couple a selected tap to each of said first and second LSB capacitors; and
    wherein, when determining the lower order bits, said SAR logic is configured to control the sets of switches to change the first and second taps from one cycle in which one of the lower order bits is determined to a next cycle in which the next of the lower order bits is determined so that the voltage of both the first and second taps changes by a decreasing amount with each succeeding bit being determined.

6. The SAR ADC of claim 5 wherein the amount of the voltage change with each succeeding lower order bit is $Vref/[2^{(n-m+1)}]$ where n is the nth bit being determined.

7. The SAR ADC of claim 5, wherein the voltage change of the first tap is in a direction opposite that of the voltage change of the second tap.

8. The SAR ADC of claim 5 wherein the direction of change of the voltage of each tap is a function of the preceding determined bit.

9. The SAR ADC of claim 5 further comprising a plurality of most significant bit (MSB) capacitors, some of which are connected to a static voltage.

10. The SAR ADC of claim 5 wherein the change in voltage on the taps depends on value of the preceding bit.

* * * * *